United States Patent
Christensen et al.

(10) Patent No.: US 7,414,878 B1
(45) Date of Patent: Aug. 19, 2008

(54) METHOD FOR IMPLEMENTING DOMINO SRAM LEAKAGE CURRENT REDUCTION

(75) Inventors: Todd Alan Christensen, Rochester, MN (US); Elizabeth Lair Gerhard, Rochester, MN (US); Omer Heymann, Moshav Tzofit (IL); Amira Rozenfeld, Herzliah (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/744,288

(22) Filed: May 4, 2007

(51) Int. Cl.
*G11C 11/40* (2006.01)

(52) U.S. Cl. .................... 365/154; 365/189.11

(58) Field of Classification Search ........... None
See application file for complete search history.

(56) References Cited

U.S. PATENT DOCUMENTS

| | | | |
|---|---|---|---|
| 5,563,839 A | 10/1996 | Herdt et al. | |
| 6,657,886 B1 | 12/2003 | Adams et al. | |
| 6,922,370 B2 | 7/2005 | Deng et al. | |
| 7,020,041 B2 * | 3/2006 | Somasekhar et al. | 365/229 |
| 7,307,907 B2 * | 12/2007 | Houston | 365/222 |
| 2005/0232054 A1 * | 10/2005 | Yamaoka et al. | 365/226 |

OTHER PUBLICATIONS

Khellah et al., A 4.2Ghz 0.3mm2 256kb Dual-Vcc SRAM Building Block in 65nm CMOS, ISSCC 2006, pp. 624-625.

* cited by examiner

*Primary Examiner*—Tan T. Nguyen
(74) *Attorney, Agent, or Firm*—Joan Pennington (57) ABSTRACT

A method and apparatus implementing domino static random access memory (SRAM) leakage current reduction include a local evaluation circuit coupled to true and complement bit lines of a pair of local SRAM cell groups, receives precharge signals and provides an output connected to a global dot line. A sleep input is applied to SRAM sleep logic and a write driver including sleep control. Data true and data complement outputs of the write driver are forced to a respective selected level to discharge the bit lines and global dot lines when the sleep input transitions high. Discharging the bit lines and global dot lines is implemented through gating in the write driver without requiring any additional devices in the local evaluation circuit.

9 Claims, 13 Drawing Sheets

METHOD FOR IMPLEMENTING DOMINO SRAM LEAKAGE CURRENT REDUCTION

FIELD OF THE INVENTION

The present invention relates generally to the data processing field, and more particularly, relates to a method and apparatus for implementing domino static random access memory (SRAM) leakage current reduction.

DESCRIPTION OF THE RELATED ART

As integrated circuit technologies advance to smaller and smaller dimensions, the percentage of power consumed by DC leakage current continues to increase. This becomes a huge challenge to overcome especially as the prevalence of hand held devices proliferates and the importance of increased battery life.

To combat this problem advanced powers saving techniques are being implemented in static logic and arrays. One approach currently being used in static random access memory (SRAM) arrays is a shutdown and/or sleep modes of operation. During shutdown or sleep mode, one of the power rails feeding the SRAM cells is allowed to collapse such that the voltage across the SRAM cell is reduced.

Figure 1:
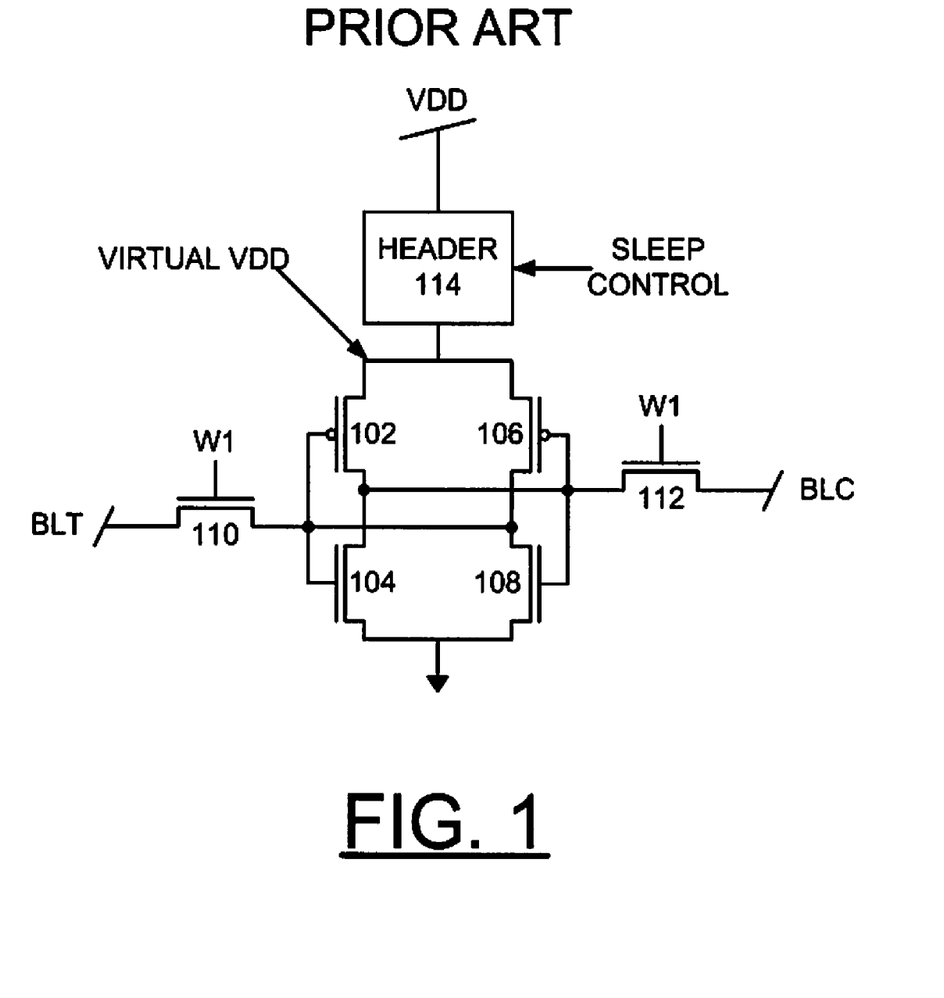
FIGS. 1, 2, and 3 illustrate a prior art six-transistor cell static random access memory (SRAM) including conventional normal and sleep or shutdown operational modes.
Figure 2:
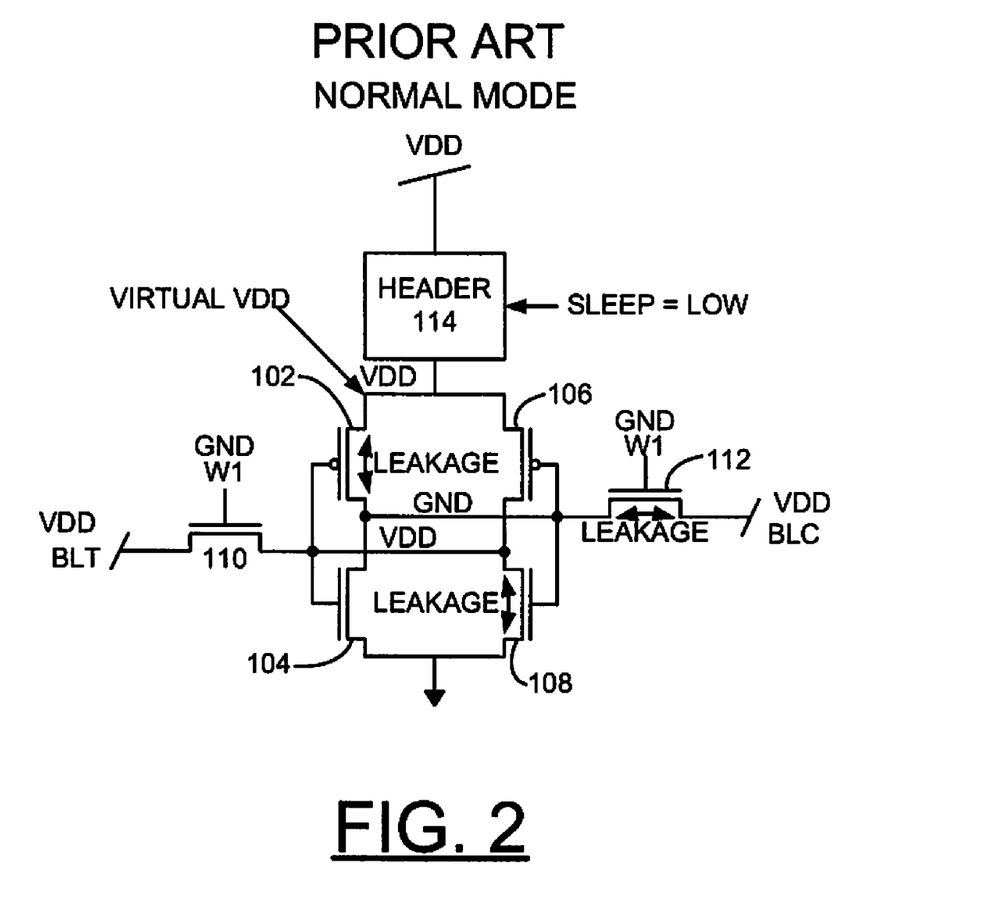

FIGS. 1 and 2 illustrate a conventional six-transistor cell static random access memory (SRAM). SRAM includes a six-transistor cell with four transistors 102, 104, 106, and 108 configured as a cross-coupled latch for storing data. A pair of transistors 110, 112 is used to obtain access to the memory cell. A wordline input W1 provides a gate input to the N-channel field effect transistor (NFETS) 110, 112. A particular wordline input W1 is activated, turning on respective NFETs to perform a read or write operation.

FIG. 2 illustrates leakage current during normal mode in the six-transistor SRAM. During a read access, differential data stored in the memory cell is transferred to the attached bit line pair, BLT, BLC. A differential voltage develops across the bit line pair. During a write access, data is written into the memory cell through the differential bit line pair 110, 112. Typically, one side of the bit line pair is driven to a logic low level potential and the other side is driven to a high voltage level. The bit lines and the word lines are selectively asserted or negated to enable at least one cell to be read or written.

If the supply is collapsed a small amount and the state of the SRAM cell is preserved, then this is called Sleep mode. If the supply is collapsed a large amount, then the SRAM memory state is lost but the leakage reduction is much more. This is typically performed using added header (PFETs) or footer (NFETs) devices in series between the normal power supply and an introduced virtual supply, as indicated at a node labeled VIRTUAL VDD in FIG. 2. As these header or footer devices are turned off, the power supply is collapsed. This results in a reduced amount of leakage current. To minimize the impact to performance, header devices are preferred for implementing sleep or shutdown mode, as shown in FIGS. 1-3.

Figure 3:
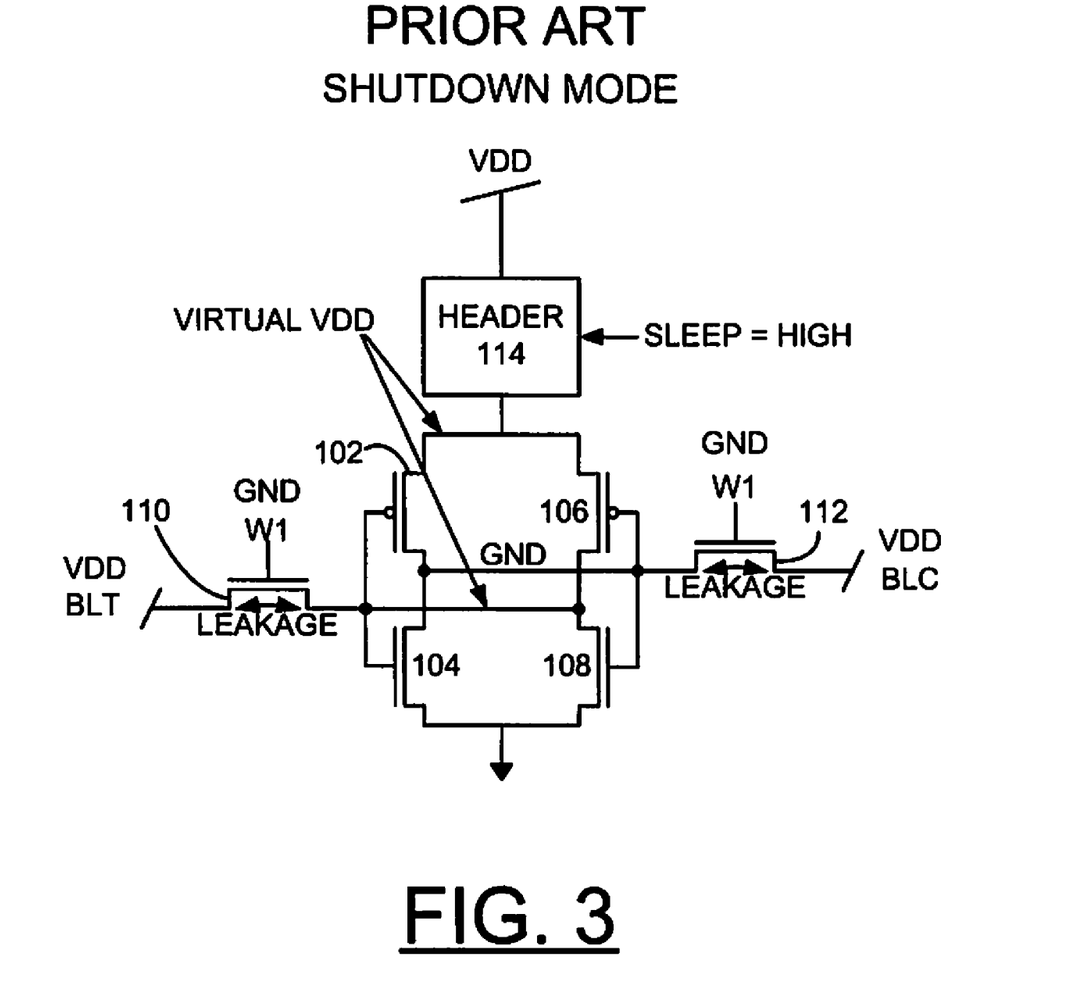

Referring to FIG. 3, a prior art shutdown mode in the six-transistor SRAM is illustrated. When the sleep input is low, then the virtual VDD is at the full rail voltage potential VDD. When the sleep input is high, then the VIRTUAL VDD is allowed to float down toward ground potential. During sleep or shutdown mode, when the virtual high supply is collapsed, the internal high nodes of the SRAM cell follows as indicated by the labels VIRTUAL VDD and GND. Typically the bitlines BLT, BLC of the SRAM cell are held in a pre-charged high state as indicated by the label VDD. Thus, there is leakage that occurs from both bitlines BLT, BLC to the collapsed voltage internal to the SRAM cell.

A need exists for an effective mechanism for implementing domino static random access memory (SRAM) leakage current reduction.

SUMMARY OF THE INVENTION

Principal aspects of the present invention are to provide a method and apparatus for implementing domino static random access memory (SRAM) leakage current reduction. Other important aspects of the present invention are to provide such method and apparatus for implementing domino static random access memory (SRAM) leakage current reduction substantially without negative effect and that overcome many of the disadvantages of prior art arrangements.

In brief, a method and apparatus are provided for implementing domino static random access memory (SRAM) leakage current reduction. A local evaluation circuit coupled to true and complement bit lines of a pair of local SRAM cell groups, receives precharge signals and provides an output connected to a global dot line. A sleep input is applied to SRAM sleep logic and a write driver including sleep control. The data true and data complement outputs of the write driver are forced to a respective selected level to discharge the bit lines and global dot lines when the sleep input transitions high.

A domino SRAM includes SRAM sleep logic that receives a sleep input. The SRAM sleep logic lowers a virtual power supply feeding SRAM cells when the sleep input transitions high. True and complement bit lines of the SRAM cells are continuous across a local SRAM cell group including a predefined number of SRAM cells. The true and complement bit lines of a pair of local SRAM cell groups are applied to a local evaluation circuit. The local evaluation circuit receives precharge signals. The local evaluation circuit provides an output connected to a global dot line, which is a dynamic net used to connect each local evaluation circuit for a given bit. A write driver provides write data inputs of a data true and a data complement to the local evaluation circuit. The write driver receives the sleep input. When the sleep input transitions high, the precharge signals are turned off, and data true and data complement are forced to a respective selected level to discharge the bit lines and global dot lines.

In accordance with features of the invention, discharging the bit lines and global dot lines through gating in the write driver results in a significant area efficient solution. For example, data true is forced low, and data complement is forced to high, to discharge the bit lines and global dot lines. The local evaluation circuit is a local read/write/precharge circuit. Discharging the bit lines and global dot lines is implemented through gating in the write driver without requiring any additional devices in the local evaluation circuit. The write driver includes a respective NAND gate receiving the sleep input and providing one NAND output that is inverted to force the data true low and one NAND output for the data complement that is forced high when the sleep input transitions high. The outputs of respective NAND gates provide the same functions of a conventional write driver during normal operation when the sleep signal is low.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method is provided to discharge the bitlines during sleep or shutdown mode. As compared to conventional arrangements, this results in a significantly larger reduction in leakage current as illustrated and described with respect to FIGS. 4, 7A, 7B, 8, 9, and 10. The implementation has been developed for domino read SRAM. Domino read SRAMs rely on short local bitlines to perform fast rail-to-rail reads. This results in frequent repetition of local read/write circuits called local evaluation circuits. It is important to keep this local evaluation circuit as small as possible since it is repeated frequently throughout the SRAM core. The implementation invented advantageously performs this bitline discharge without requiring any additional devices to be added to the local evaluation circuit, which results in an area efficient solution.

Figure 4:
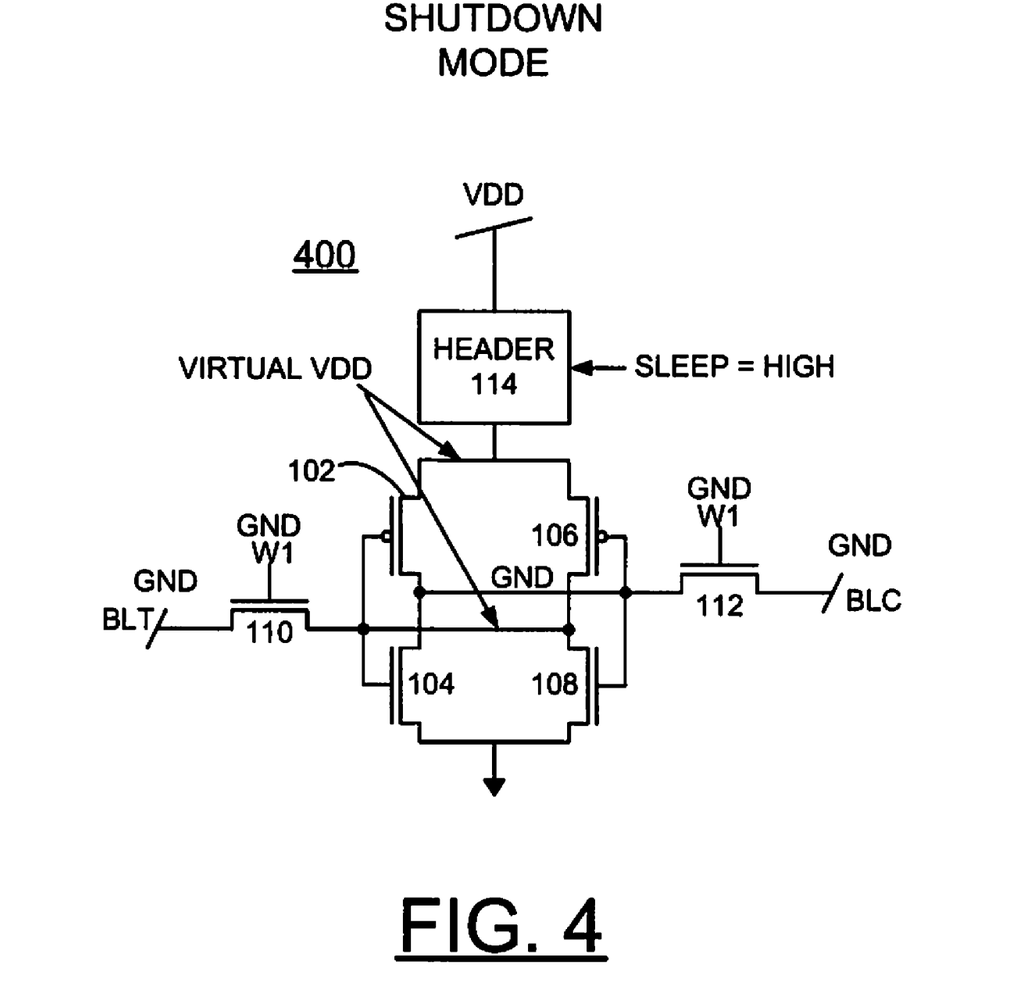
FIG. 4 is a schematic diagram of a six-transistor cell static random access memory (SRAM) implementing a sleep or shutdown mode in accordance with the preferred embodiment.

Having reference now to the drawings, in FIG. 4, there is shown a six-transistor cell static random access memory (SRAM) generally designated by the reference character 400 implementing a sleep or shutdown mode in accordance with the preferred embodiment.

Six-transistor cell SRAM 400 includes a four transistor cross-coupled latch including a cross-coupled first series connected P-channel field effect transistor (PFET) 102 and an N-channel field effect transistor (NFET) 104, and second series connected PFET 106 and NFET 108 for storing data. A pair of transistors 110, 112 is used to obtain access to the memory cell. A header 114 defined by at least one PFET produces an introduced virtual supply indicated at a header node labeled VIRTUAL VDD.

Operation during the sleep or shutdown mode in accordance with the preferred embodiment is illustrated in FIG. 4. The header device 114 is turned off, the power supply is collapsed toward ground potential indicated by the label VIRTUAL VDD at the cross-coupled latch node VIRTUAL VDD. This results in a reduced amount of leakage. A method has been invented to discharge the bitlines BLT, BLC during sleep or shutdown mode indicated by the label GND at the bitlines BLT, BLC. This results in an even larger reduction in leakage current.

Typically the bitlines BLT, BLC of the SRAM cell are held in a pre-charged high state during the sleep or shutdown mode, as illustrated in FIG. 3.

In the implementation of domino read SRAM 400 of the invention, the short local bitlines BLT, BLC are discharged when shutdown or sleep mode are enabled, without providing any additional devices in a local evaluation circuit. As illustrated in FIGS. 7A, 7B, 8, and 9, a write driver circuit of the invention discharges the local bitlines BLT, BLC of the SRAM cells 400.

Figure 5A:
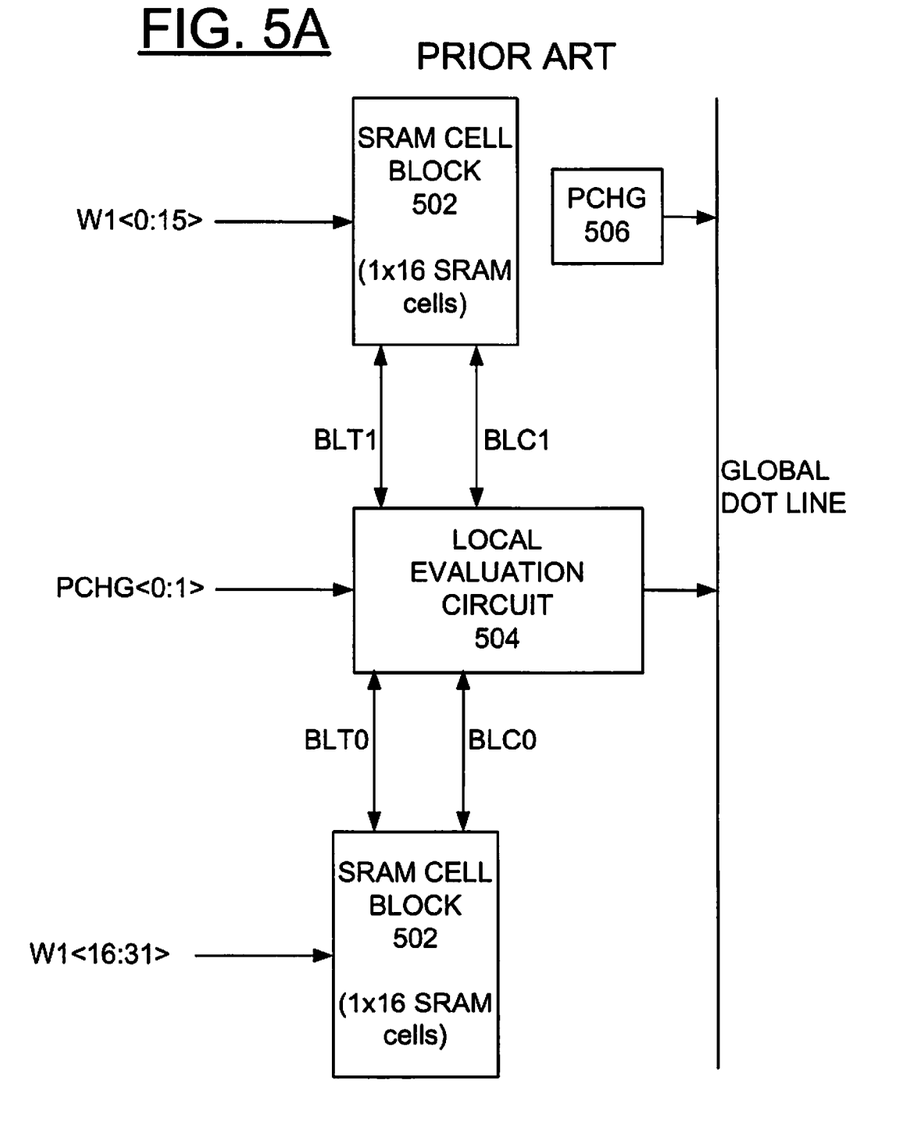
FIGS. 5A and 5B illustrate a prior art domino SRAM design and an exemplary local evaluation circuit used for a pair of SRAM cell blocks.

FIG. 5A illustrates a prior art domino SRAM design having a pair of SRAM cell blocks 502 arranged in groups of cells, such as sixteen cells per group 502, used with a local evaluation circuit 504. Each cell in a group is connected to a local bit line pair, BLT0, BLC0, and BLT1, BLC1. The bit lines are continuous across the group of 16 cells within each SRAM cell block 502. The local bit line pair for each group of cells or each SRAM cell block 502 is coupled to local evaluation circuit 504 providing an output of a global dot line. In the domino SRAM, the read or write operation is performed by initially pre-charging the bit lines and, after pre-charging, true and complement data is made available on the bit lines. The local evaluation circuit 504 is designed such that 2 groups 502 of 16 SRAM cells can applied to one local evaluation with the output of each local evaluation circuit 504 connecting into the global dot line. A precharge (PCHG) circuit 506 provides precharge signals to the global dot line. The global dot line is a dynamic net used to connect each local evaluation circuit 504 for a given bit. For example, a bit with 256 wordlines includes 8 local evaluation circuits 504 connecting into the global dot line and 16 cell blocks 502 of 16 cells.

Figure 5B:
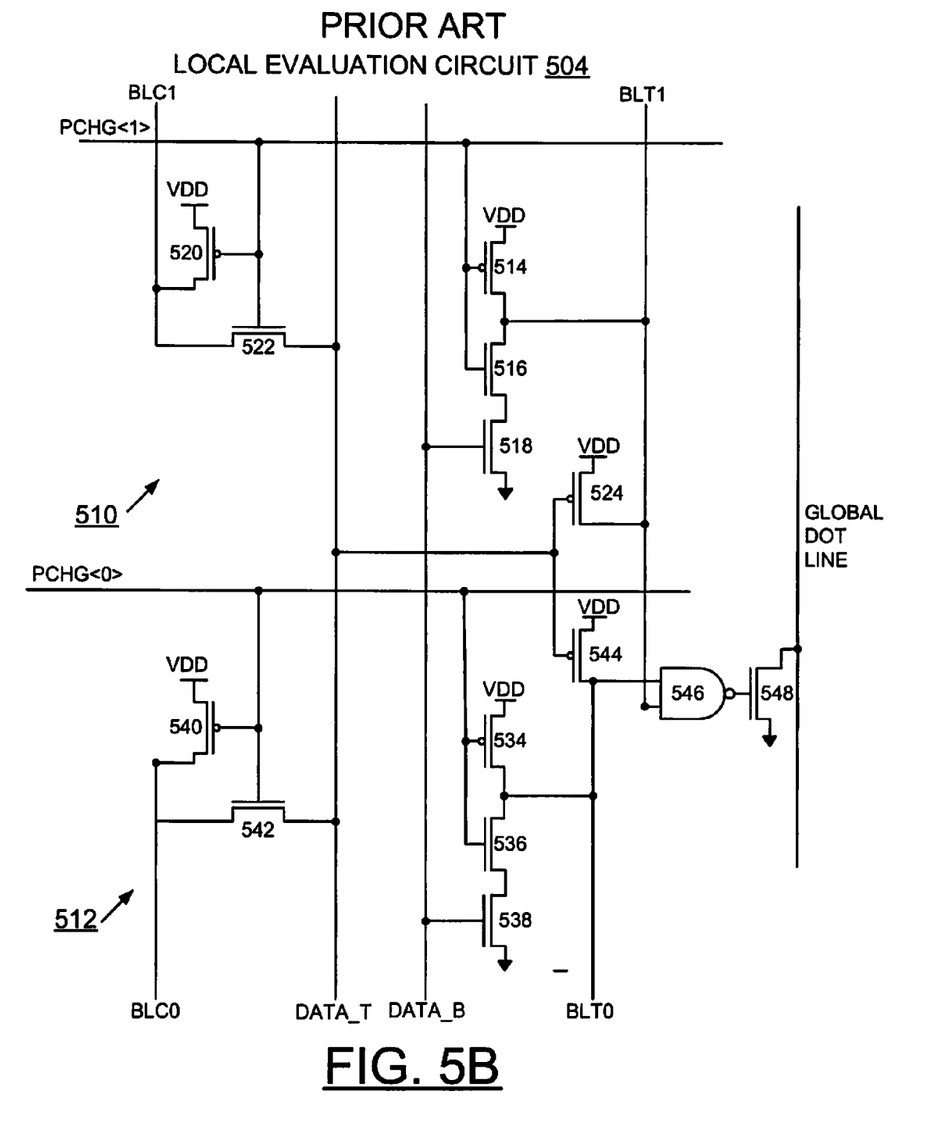

FIG. 5B provides an exemplary implementation of the local evaluation circuit 504. As shown, local evaluation circuit 504 includes a write and restore function generally designated by 510 coupled to bitlines BLT1, BLC1, and a write and restore function generally designated by 512 coupled to bitlines BLT0, BLC0. The BLT1, BLC1 write and restore function 510 includes a first transistor stack connected between a voltage supply VDD and ground including a PFET 514 connected in series with a pair of series connected NFETs 516, 518. A series connected PFET 520 and NFET 522 is connected between bitline BLC1 and input DATA_T. A PFET 524 is connected between voltage supply VDD and bitline BLT1. A respective gate of PFET 514 and NFET 516, and PFET 520 and NFET 522 is connected to a first precharge signal PCHG<1>. The common drain connection of PFET 514 and NFET 516 is connected to bitline BLT1. The gate of PFET 524 is connected to input DATA_T. The gate of NFET 518 is connected to input DATA_B.

The BLT0, BLC0 write and restore function 512 includes a first transistor stack connected between a voltage supply VDD and ground including a PFET 534 connected in series with a pair of series connected NFETs 536, 538. A series connected PFET 540 and NFET 542 is connected between bitline BLC0 and input DATA_T. A PFET 544 is connected between voltage supply VDD and bitline BLT0. A respective gate of PFET 534 and NFET 536, and PFET 540 and NFET 542 is connected to a first precharge signal PCHG<0>. The common drain connection of PFET 534 and NFET 536 is connected to bitline BLT0. The gate of PFET 544 is connected to input DATA_T. The gate of NFET 538 is connected to input DATA_B.

The local evaluation circuit 504 includes read devices of a two-input NAND gate 546 coupled to the bitlines BLT0, BLT1 and an NFET 548 connected between the GLOBAL DOT LINE and ground. The output of NAND gate 546 is applied to the gate of NFET 548 driving the GLOBAL DOT LINE.

Figure 6A:
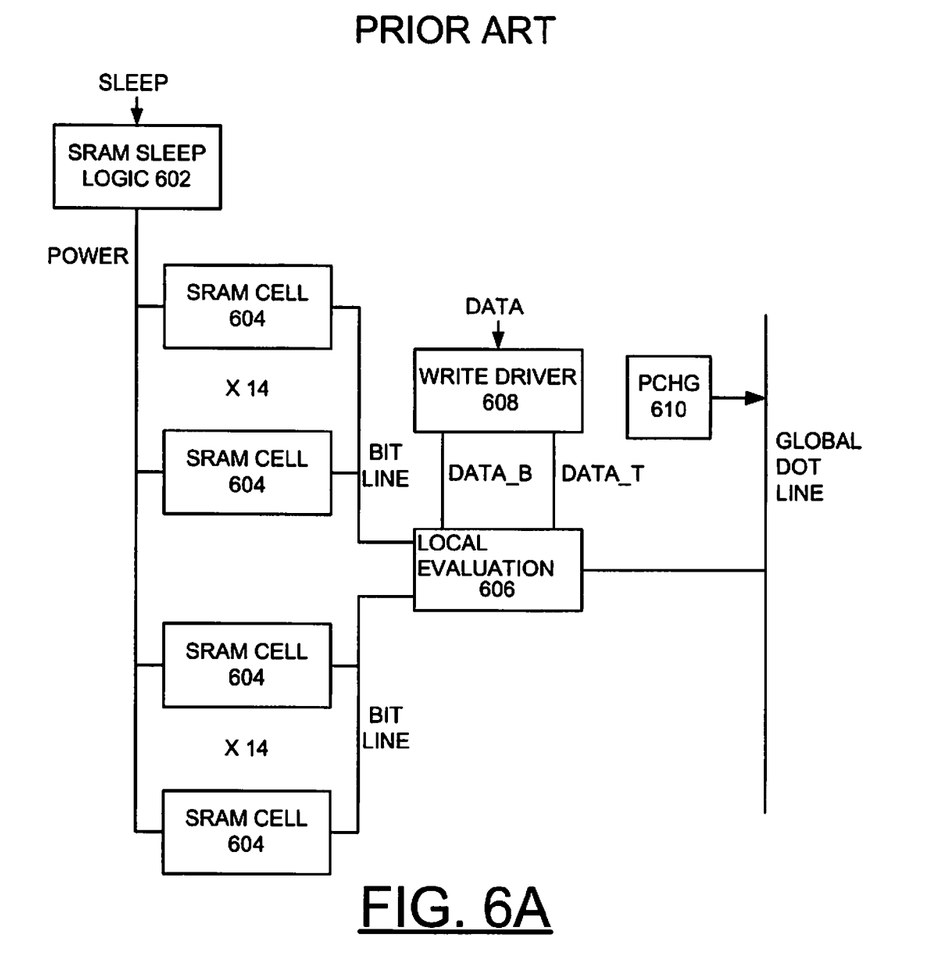
FIGS. 6A and 6B illustrate a prior art SRAM sleep mode and prior art write driver without sleep control.
Figure 6B:
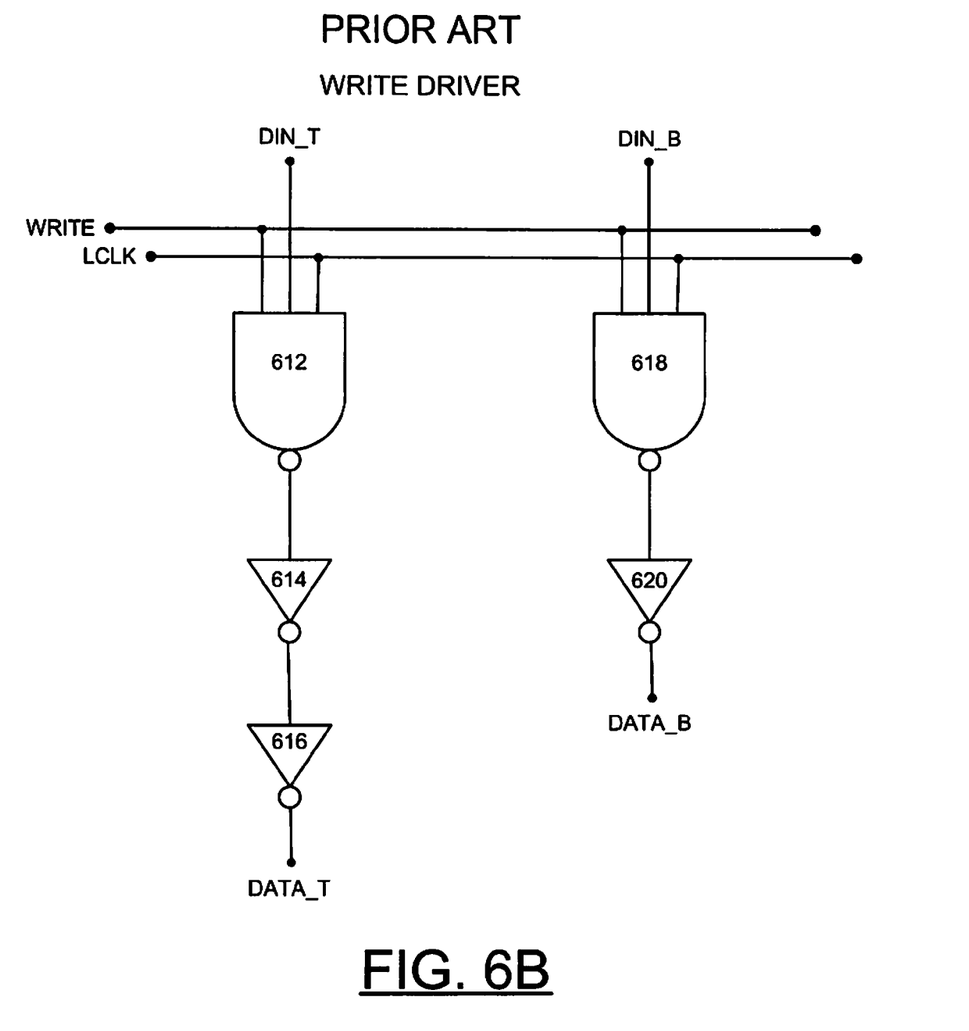

FIGS. 6A and 6B illustrate a prior art SRAM sleep mode implementation and prior art write driver without sleep control. As shown in FIG. 6A, the prior art SRAM sleep mode implementation includes a SRAM sleep logic 602 coupled to SRAM cells 604, that are shown arranged in groups of sixteen cells per group, with x14 indicated between first and last SRAM cells 604 shown in two groups. Bit line from two groups of sixteen SRAM cells are shown connected to a local evaluation circuitry 606 connected to the global dot line. A write driver 608 receiving data input labeled DATA applies inputs DATA_B, DATA_T to the local evaluation circuitry 606. A precharge (PCHG) circuit 610 is connected to the GLOBAL DOT LINE.

The prior art SRAM sleep mode implementation reduces the leakage current by lowering the power supply feeding the SRAM cells 604. The precharge signals will remain on to prevent the bit lines from discharging to an unknown state. This prevents the global dot line from discharging.

FIG. 6B illustrates the prior art write driver that is implemented in conventional arrangement without sleep control. A first three-input NAND gate 612 is coupled to inputs WRITE, clock LCLK, and data input true DIN_T. The output of NAND gate 612 is applied to a pair of series connected inverters 614, 616 providing output DATA_T. A second three-input NAND gate 618 is coupled to inputs WRITE, clock LCLK, and data input complement DIN_B. The output of NAND gate 618 is applied to an inverter 620 providing output DATA_B.

In accordance with features of the invention, improvement upon the current shutdown or sleep operating mode is to logically manipulate the outputs of the write circuitry such that the bit lines are discharged when shutdown or sleep mode are enabled. The invention performs this function without any additional devices in the local evaluation circuit, which results in a very area efficient solution.

Figure 7A:
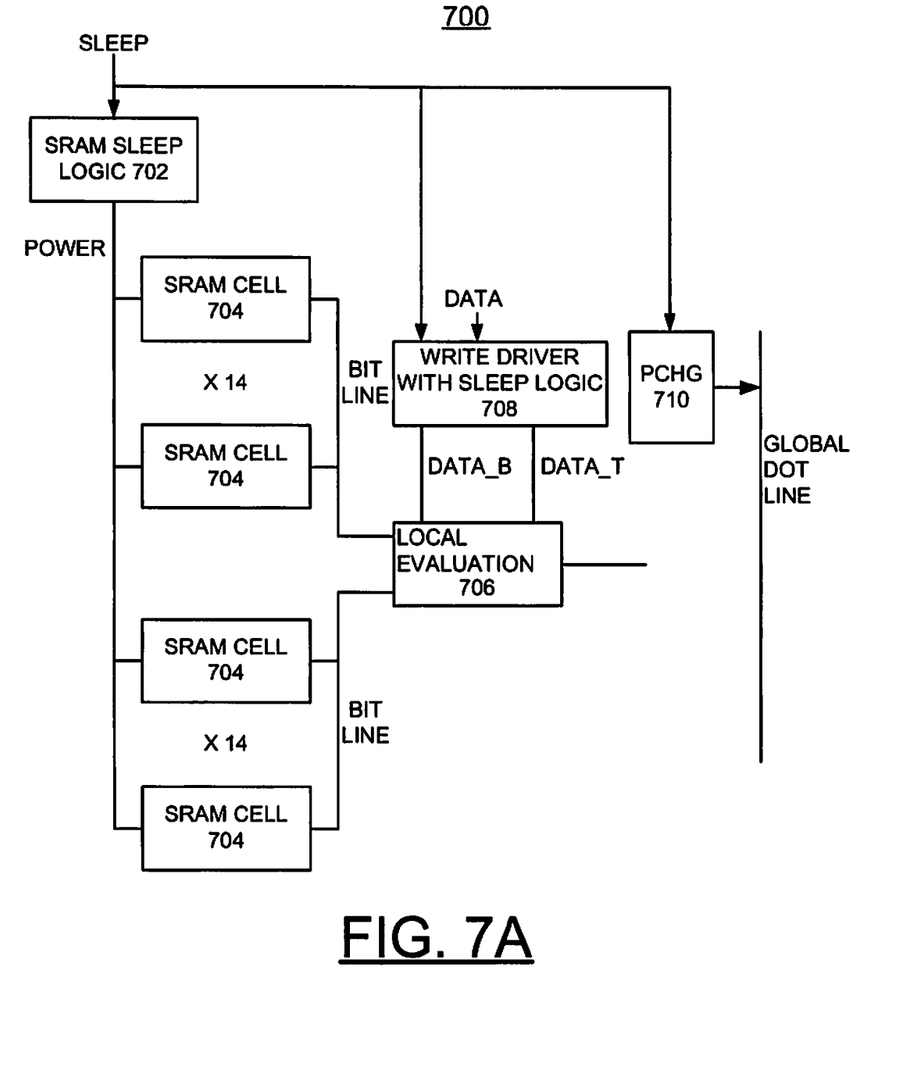
FIGS. 7A and 7B illustrate SRAM sleep implementation and a write driver with sleep control in accordance with the preferred embodiment.

Referring now to FIG. 7A, there is shown an exemplary SRAM sleep implementation generally designated by the reference character 700 implementing a sleep or shutdown mode in accordance with the preferred embodiment. SRAM sleep implementation 700 includes a SRAM sleep logic 702 coupled to SRAM cells 704, that are shown arranged in groups of sixteen cells per group, with x14 indicated between first and last SRAM cells 704 shown in two groups. Bit lines from two groups of sixteen SRAM cells are shown connected to a local evaluation circuitry 706 that is connected to the global dot line. A write driver 708 receiving data input labeled DATA and the sleep input, applied inputs DATA_B, DATA_T to the local evaluation circuitry 606. A precharge (PCHG) circuit 710 receiving the sleep input is connected to the global dot line.

Upon the current shutdown or sleep operating mode, the outputs of the write circuitry or the write driver 708 are logically manipulated such that the bit lines are discharged when shutdown or sleep mode are enabled.

In the SRAM sleep implementation 700, all precharge signals feeding discharged global dot and bit lines must be turned off during the sleep or shutdown mode in accordance with the preferred embodiment. Otherwise, a DC current path would result from precharge signals when the global dot and bit lines are discharged with shutdown or sleep mode enabled. The sleep signal is applied to the precharge logic including PCHG circuit 710 to turn off the precharge signals for the shutdown or sleep mode.

Figure 7B:
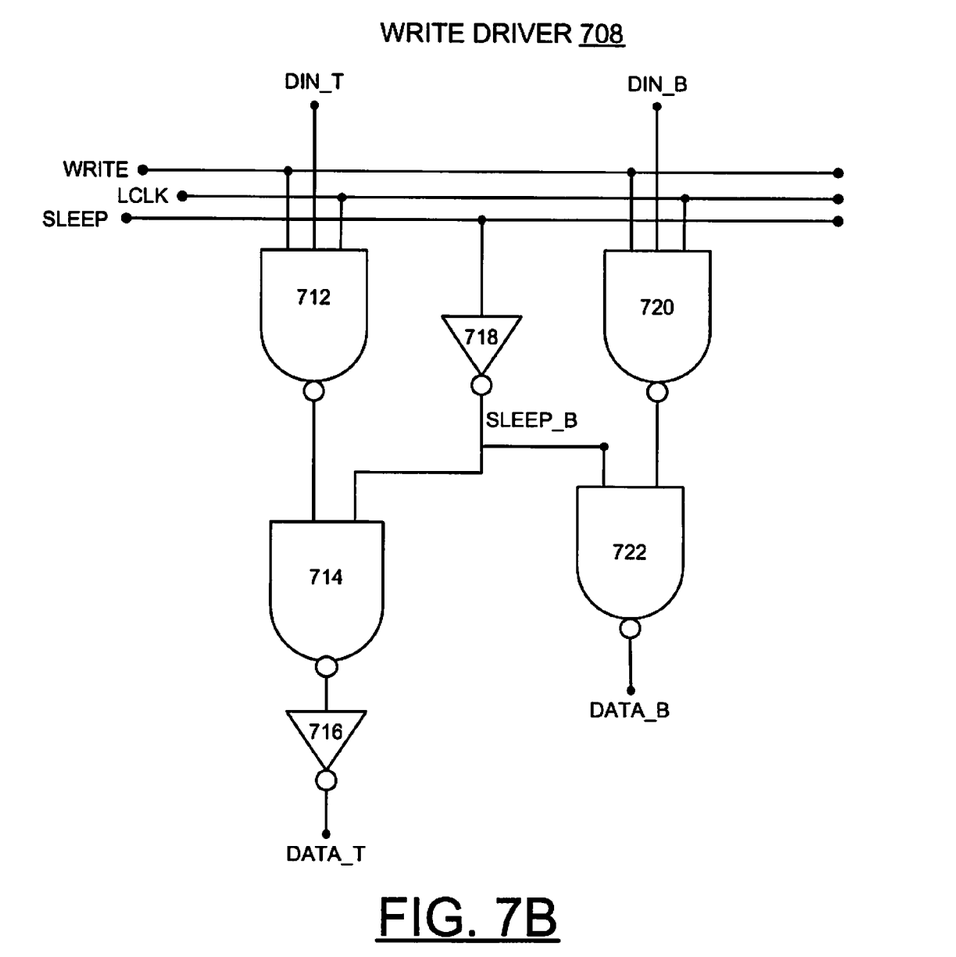

FIG. 7B illustrates the prior art write driver that is implemented in accordance with the preferred embodiment. A first three-input NAND gate 712 is coupled to inputs WRITE, clock LCLK, and data input true DIN_T. The output of NAND gate 712 is applied to a two-input NAND gate 714 having an output connected to an inverter 716. The two-input NAND gate 714 receives an input SLEEP_B from the output of an inverter 718 connected to the sleep input SLEEP. The output of the inverter 716 provides output DATA_T. A second three-input NAND gate 720 is coupled to inputs WRITE, clock LCLK, and data input complement DIN_B. A two-input NAND gate 722 receives inputs SLEEP_B and the output of NAND gate 720, providing output DATA_B.

Figure 8:
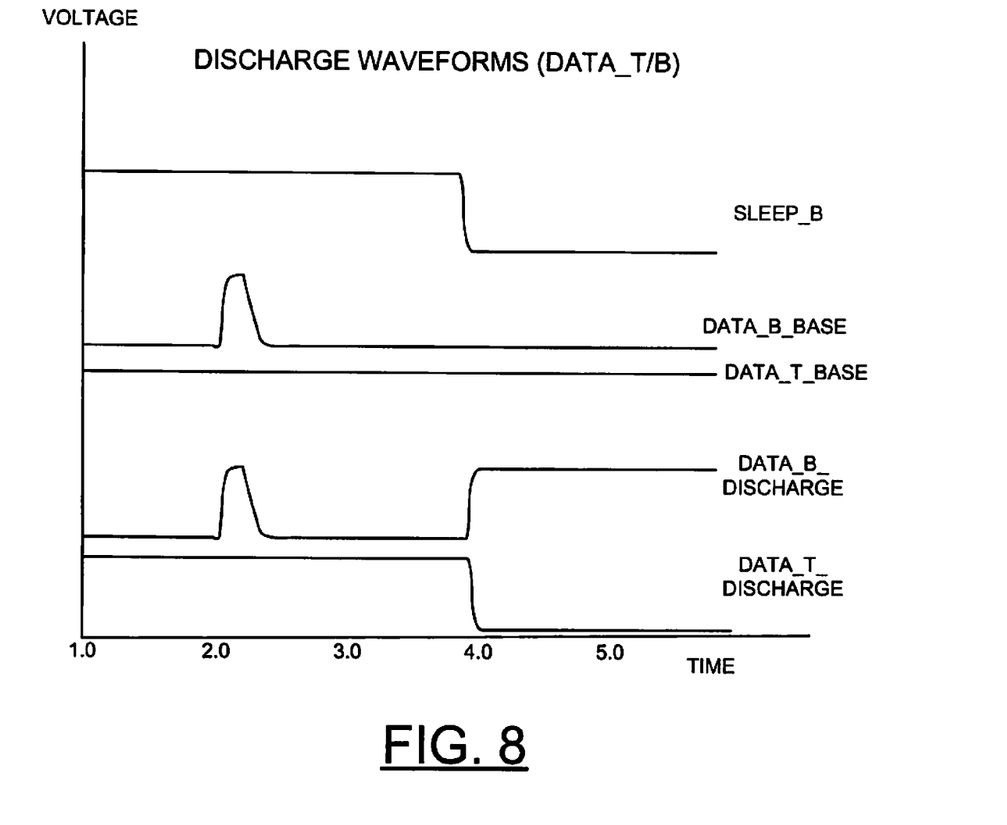
FIGS. 8 and 9 are timing diagrams illustrating the operation of the SRAM sleep implementation and write driver with sleep control in accordance with the preferred embodiment.
Figure 9:
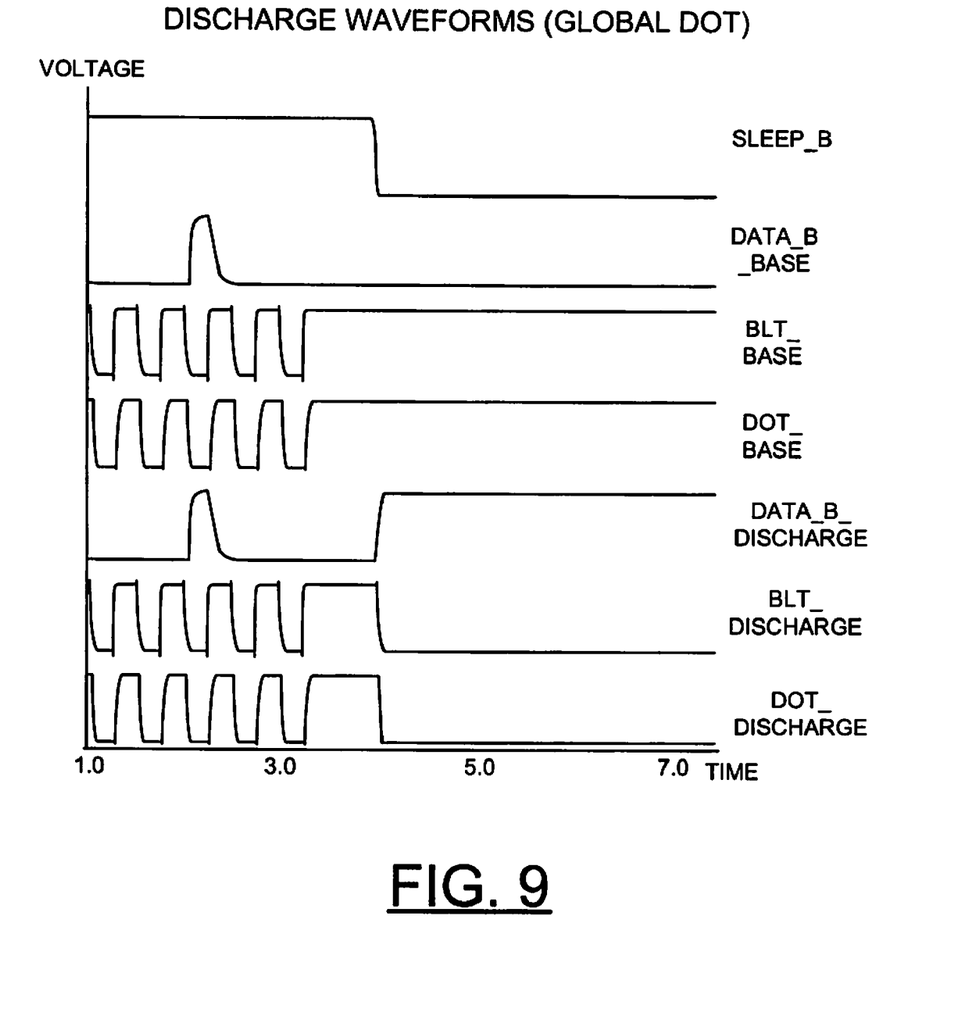

FIGS. 8 and 9 are timing diagrams illustrating the operation of the SRAM sleep implementation and write driver with sleep control in accordance with the preferred embodiment. In FIGS. 8 and 9, discharge waveforms are shown with the inverted sleep input shown at a line labeled SLEEP_B.

Referring to FIG. 8, exemplary data inputs are shown at lines labeled DATA_B_BASE, DATA_T_BASE. When the SLEEP_B is driven low, data input DATA_B_DISCHARGE is driven high. This causes the global dot line to discharge. When SLEEP_B is high during normal operation, the DATA_B_BASE and the data input DATA_B_DISCHARGE have the same functionality.

Referring to FIG. 9, when the SLEEP_B is low and data input DATA_B_DISCHARGE goes high, the bitline BLT_DISCHARGE and the global dot line DOT_DISCHARGE discharge to zero, while DOT_BASE stays high or at 1.

Figure 10:
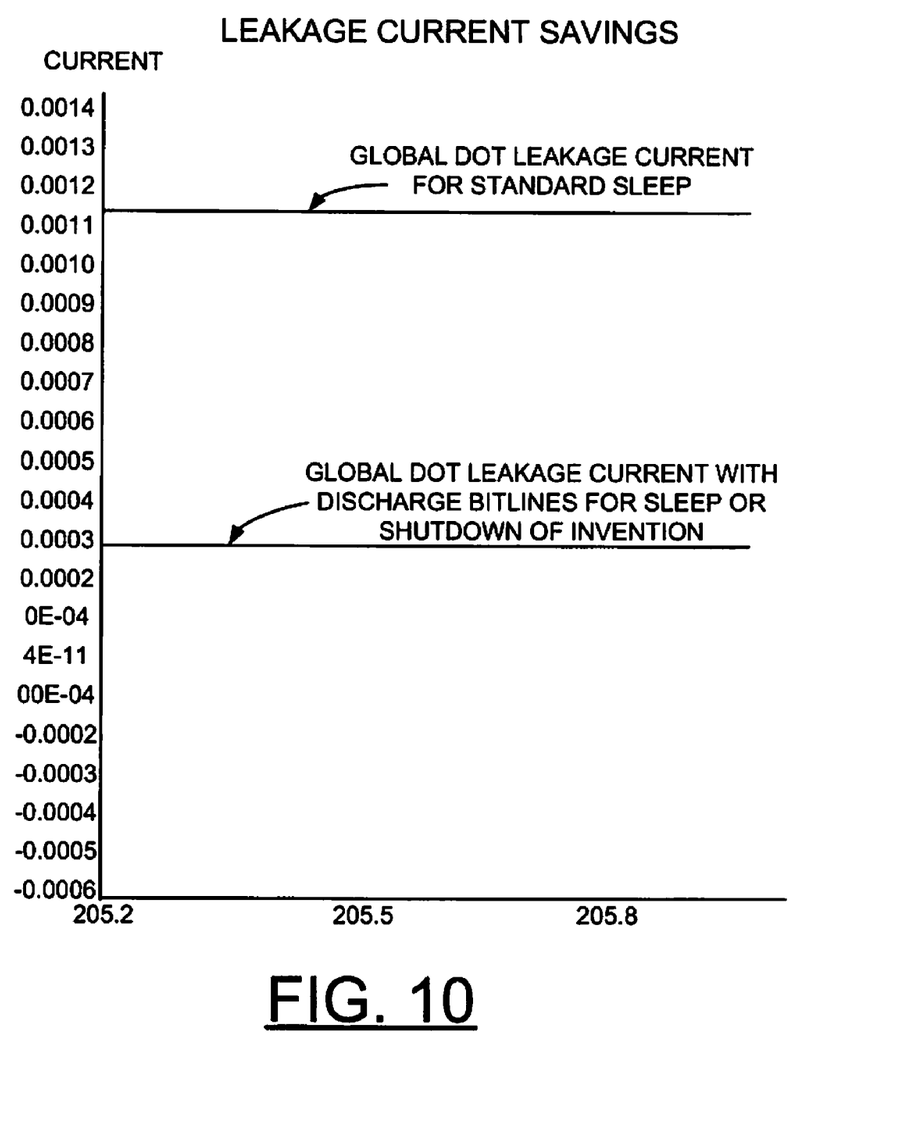
FIG. 10 is a chart illustrating improved leakage current performance with the write driver with sleep control in accordance with the preferred embodiment.

FIG. 10 is a chart illustrating improved leakage current performance with the write driver with sleep control in accordance with the preferred embodiment. Analysis shows that by discharging the bit lines savings of approximately 75% on the leakage current is achieved. For example, as shown in FIG. 10, leakage current on the global dot is around 1,148 nA in the standard sleep implementation and is about 296 nA for the discharged bitlines for the sleep or shutdown implementation of the invention.

While the present invention has been described with reference to the details of the embodiments of the invention shown in the drawing, these details are not intended to limit the scope of the invention as claimed in the appended claims.

What is claimed is:

1. A method for implementing domino static random access memory (SRAM) leakage current reduction comprising the steps of:
   providing a local evaluation circuit connected to true and complement bit lines of a pair of local SRAM cell groups, and an output of said local evaluation circuit connected to a global dot line;
   applying write data true and data complement signals to said local evaluation circuit; and
   providing a respective selected level to said local evaluation circuit for both data true and data complement signals to discharge the true and complement bit lines when a sleep control input transitions high.

2. The method for implementing domino SRAM leakage current reduction as recited in claim 1 includes reducing a voltage across said SRAM cells when a sleep control input transitions high.

3. The method for implementing domino SRAM leakage current reduction as recited in claim 1 wherein providing said respective selected level to said local evaluation circuit includes gating a write driver to logically manipulate data true and data complement outputs of said write driver; said data true output forced low and said data complement output forced high.

4. The method for implementing domino SRAM leakage current reduction as recited in claim 1 includes discharging said global dot line.

5. The method for implementing domino SRAM leakage current reduction as recited in claim 1 wherein providing said high level to said local evaluation circuit includes providing a write driver with sleep control logic.

6. The method for implementing domino SRAM leakage current reduction as recited in claim 5 includes providing a respective gate of said write driver for receiving said sleep control input.

7. The method for implementing domino SRAM leakage current reduction as recited in claim 5 includes providing a respective NAND gate of said write driver having an input receiving said sleep control input.

8. The method for implementing domino SRAM leakage current reduction as recited in claim 1 includes applying precharge signals to said local evaluation circuit.

9. The method for implementing domino SRAM leakage current reduction as recited in claim 8 includes turning off said precharge signals when a sleep control input transitions high.

* * * * *